US012727420B2

(12) United States Patent
Choi et al.

(10) Patent No.: US 12,727,420 B2
(45) Date of Patent: Sep. 1, 2026

(54) METHOD AND APPARATUS FOR DRY-CLEANING AlN HEATER FOR SEMICONDUCTOR FABRICATION EQUIPMENT

(71) Applicant: WONIK QNC Corporation, Gumi-si (KR)

(72) Inventors: Eun Young Choi, Hwaseong-si (KR); Sang Hyun Cho, Suwon-si (KR); Seung Jin Jung, Seoul (KR); Joo Hee Jang, Hwaseong-si (KR); So Young Choi, Anseong-si (KR); Dong Ho Shin, Seoul (KR); Jong Hwan Mun, Anseong-si (KR); Min Seob Jung, Seoul (KR)

(73) Assignee: WONIK QNC CORPORATION, Gumi-si (KR)

( * ) Notice: Subject to any disclaimer, the term of this patent is extended or adjusted under 35 U.S.C. 154(b) by 103 days.

(21) Appl. No.: 18/637,303

(22) Filed: Apr. 16, 2024

(65) Prior Publication Data

US 2024/0363328 A1 Oct. 31, 2024

(30) Foreign Application Priority Data

Apr. 27, 2023 (KR) ........................ 10-2023-0055800

(51) Int. Cl.
*H10P 70/00* (2026.01)
*C23C 16/44* (2006.01)
*H10P 95/90* (2026.01)

(52) U.S. Cl.
CPC .......... *H10P 70/12* (2026.01); *C23C 16/4405* (2013.01); *H10P 95/904* (2026.01)

(58) Field of Classification Search
None
See application file for complete search history.

(56) References Cited

U.S. PATENT DOCUMENTS

| | | | |
|---|---|---|---|
| 9,212,099 B2 | 12/2015 | Sun et al. | |
| 11,837,448 B2 | 12/2023 | Sheng et al. | |
| 2002/0189636 A1* | 12/2002 | Sun | C23C 16/4405 134/1 |

FOREIGN PATENT DOCUMENTS

| | | |
|---|---|---|
| CN | 101219430 A | 7/2008 |
| CN | 108249957 A | 7/2018 |

(Continued)

OTHER PUBLICATIONS

KR20140001023 English translation, accessed on Dec. 2025. (Year: 2014).*
Chinese Office Action mailed on Mar. 17, 2026, 7 pages.

*Primary Examiner* — Kaj K Olsen
*Assistant Examiner* — Arlyn I Rivera-Cordero
(74) *Attorney, Agent, or Firm* — You & IP, LLC

(57) ABSTRACT

Provided is a method and an apparatus for dry-cleaning an aluminum nitride (AlN) heater for semiconductor fabrication equipment, which may efficiently remove fluorine-containing contaminants generated on the AlN heater during semiconductor fabrication processes, and especially, may effectively and simultaneously remove organic, inorganic metallic, and inorganic contaminants. The method for dry-cleaning an AlN heater for semiconductor fabrication equipment includes steps of: determining a laser to be used for the AlN heater; determining laser control factors required for cleaning the AlN heater with respect to the laser to be used determined in the step of determining the laser to be used; and cleaning the AlN heater by laser irradiation based on the laser control factors determined in the step of determining the laser control factors.

8 Claims, 11 Drawing Sheets

(56) References Cited

FOREIGN PATENT DOCUMENTS

| | | | |
|---|---|---|---|
| JP | 2021-106278 | A | 7/2021 |
| KR | 10-0536449 | B1 | 12/2005 |
| KR | 10-2012-0021514 | A | 3/2012 |
| KR | 10-2014-0001023 | A | 1/2014 |
| KR | 10-1391883 | B1 | 5/2014 |
| KR | 10-1793431 | B1 | 11/2017 |
| KR | 10-1995688 | B1 | 7/2019 |
| TW | 202243083 | A | 11/2022 |

* cited by examiner

| Classification | Before cleaning | After cleaning |
| --- | --- | --- |
| Conventional cleaning (Bead Blast) | 0 0.01 0.02 0.03 0.04 | 0 0.01 0.02 0.03 0.04 |
| Dimple Size (Height) | Ave. 0.023mm | Ave. 0.018mm (-0.005mm) |

| Classification | Before cleaning | After cleaning |
| --- | --- | --- |
| Dry cleaning | 0 0.01 0.02 0.03 0.04 | 0 0.01 0.02 0.03 0.04 |
| Dimple Size (Height) | Ave. 0.019mm | Ave. 0.020mm (+0.001) |

FIG. 10

| Area | Test conditions |
| --- | --- |
| 1 | None-Cleaning (B.M) |
| 4 | IR Laser |

METHOD AND APPARATUS FOR DRY-CLEANING AlN HEATER FOR SEMICONDUCTOR FABRICATION EQUIPMENT

BACKGROUND

1. Technical Field

The present disclosure relates to a method and an apparatus for dry-cleaning an aluminum nitride (AlN) heater for semiconductor fabrication equipment, and more specifically, to a method and an apparatus for dry-cleaning an AlN heater for semiconductor fabrication equipment, which can efficiently remove fluorine-containing contaminants generated on the AlN heater during semiconductor fabrication processes, and especially, can effectively and simultaneously remove organic, inorganic metallic, and inorganic contaminants.

2. Related Art

Recently, in response to the demand for lower-cost and higher-performance semiconductor devices, there has been a demand for high productivity and high quality in film formation processes.

In a semiconductor fabrication apparatus in which process gas is supplied from the top and epitaxial growth on a wafer is performed while heating energy at a certain temperature is supplied to the wafer, excess process gas and reaction by-products are discharged downward from the end of the wafer.

However, the reaction by-products cause a problem in that they are deposited in the reaction chamber and in an exhaust system such as a pump, generating dust, or clog the exhaust system, lowering the yield.

Therefore, it is necessary to regularly remove deposits in the reaction chamber using a cleaning gas, but the cleaning is performed in a state in which the apparatus is stopped, which significantly reduces productivity.

In particular, in an SiC film formation process, it is necessary to use a highly reactive gas such as $ClF_3$ gas as a cleaning gas, and safety considerations such as completely discharging $H_2$ gas that reacts explosively with the cleaning gas are required.

Technologies to solve this problem include Korean Patent No. 10-1391883.

In addition, as $NF_3$ gas is used for chamber cleaning, technology is needed to solve the problem that aluminum fluoride (AlF) is generated on the AlN heater.

This will now be described with reference to FIG. 1. FIG. 1 is a configuration diagram including a vacuum chamber for general semiconductor fabrication equipment.

As shown in FIG. 1, the semiconductor fabrication apparatus includes an AlN heater 20 configured to mount a wafer thereon in a reaction chamber 10, and a showerhead 40 through which process gas is supplied to the reaction chamber 10.

When the wafer 30 is mounted on the AlN heater 20 for semiconductor fabrication, process gas is introduced through a pipe 50 and supplied to the wafer 30 through the showerhead 40 to generate plasma. At the same time, heating energy at a certain temperature is supplied from the AlN heater 20 to the wafer 30, thereby fabricating a semiconductor device.

In order to deposit semiconductor thin films, a vacuum chamber is used in most cases. When thin film deposition is performed, reaction by-products accumulate in the vacuum chamber, thus generating particles. For this reason, it is necessary to clean the chamber periodically after thin film deposition.

Chamber cleaning is performed by introducing $NF_3$ gas, a fluorine-based gas, into the chamber in radical form using a remote plasma generator (RPG).

However, the fluorine radicals supplied for chamber cleaning do not only remove reaction by-products remaining in the chamber, but also react with the heater material AlN at a certain temperature (for example, 460° C.) or higher, and thus AlF is deposited on the heater 20 (see the right side of FIG. 1).

If the thin film deposition process is performed in a state in which the AlF deposited on the heater 20 as described above remains without being removed, the AlF adheres to the wafer 30 and becomes particles. Thus, the AlF is considered as one of the main causes of deterioration in the quality of semiconductor devices. In addition, as the dielectric properties of the AlN heater change due to the AlF, problems such as changes in thin film thickness become more serious.

In other words, fluorine radical ions generated by plasma decomposition react with the surface of the AlN heater to generate AlF contaminants, and AlF contaminants are repeatedly generated as the deposition process and the cleaning process are repeated. These AlF contaminants have problems in that they cause corrosion of the AlN heater, causing a decrease in the thickness and strength of the AlN heater and cracking of the AlN heater, and cause particle adhesion to the wafer surface, thus lowering the yield.

Recently, various technologies such as wet cleaning methods have been attempted to overcome these problems. However, these problems have still not been resolved, and thus serious problems arise in that the AlN heater needs to be replaced with a fresh product after a certain period of use, resulting in an increase in the production cost, and the operation rate decreases due to reduction in the PM cycle. Furthermore, an additional problem arises in that AlN heater products are expensive products that rely entirely on imports, and they cause a waste of foreign currency.

Therefore, there is an urgent need to develop technology for removing AlF generated on the AlN heater during chamber cleaning.

PRIOR ART DOCUMENTS

Patent Documents

Korean Patent No. 10-1391883 (published on May 7, 2014)

Korean Patent No. 10-0536449 (published on Dec. 16, 2005)

Korean Patent No. 10-1793431 (published on Nov. 3, 2017)

Korean Patent Application Publication No. 10-2014-0001023 (published on Jan. 6, 2014)

Korean Patent Application Publication No. 10-2012-0021514 (published on Mar. 9, 2012)

SUMMARY

Therefore, the present disclosure has been made in order to solve the above-mentioned problems occurring in the prior art, and an object of the present disclosure is to provide a method and an apparatus for dry-cleaning an aluminum nitride (AlN) heater for semiconductor fabrication equipment, which can efficiently remove fluorine-containing contaminants generated on the AlN heater during semiconductor fabrication processes, and especially, can effectively and simultaneously remove organic, inorganic metallic, and inorganic contaminants.

Objects to be achieved by the present disclosure are not limited to the objects mentioned above, and other objects not mentioned above may be clearly understood by those skilled in the art from the following description.

According to one aspect of the present disclosure for achieving the objects and other features of the present disclosure, there is provided a method for dry-cleaning an AlN heater for semiconductor fabrication equipment, the method including steps of: determining a laser to be used for the AlN heater; determining laser control factors required for cleaning the AlN heater with respect to the laser to be used determined in the step of determining the laser to be used; and cleaning the AlN heater by laser irradiation based on the laser control factors determined in the step of determining the laser control factors.

According to another aspect of the present disclosure, there is provided an apparatus for dry-cleaning an AlN heater for semiconductor fabrication equipment, the apparatus including: a laser irradiation device configured to irradiate the AlN heater with a laser; and a laser control unit configured to control factors for the laser irradiated from the laser irradiation device, wherein the laser irradiation device is a laser irradiation device that irradiates at least one of an IR laser and a UV laser.

The method and apparatus for dry-cleaning an AlN heater for semiconductor fabrication equipment according to the present disclosure provide the following effects.

First, according to the present disclosure, it is possible to efficiently and effectively remove fluorine-containing contaminants, especially organic, metallic, and inorganic contaminants at the same time, generated on the AlN heater.

Second, according to the present disclosure, it is possible to remove submicron-sized contaminants, thereby minimizing changes in roughness, and to minimize damage to the dimple portion of the AlN heater dimples, thereby increasing the lifespan of the AlN heater product.

Third, according to the present disclosure, it is possible to replace mass-production cleaning that is based on chemical treatment or bead blasting.

BRIEF DESCRIPTION OF THE DRAWINGS

FIG. 10 shows the results of comparing the height of the dimple portion (pinhole or lifting hole) of an AlN heater in an experiment on the method for dry-cleaning an AlN heater for semiconductor fabrication equipment according to the present disclosure.

DETAILED DESCRIPTION

Specific embodiments according to the present disclosure will be described below with reference to the accompanying drawings. However, this is not intended to limit the invention to any particular embodiment, and is to be understood to include all modifications, equivalents, and substitutions that fall within the idea and technical scope of the invention.

Throughout the specification, parts having like construction and operation are designated by the same reference signs. In addition, the accompanying drawings of the present disclosure are for the convenience of illustration only, and shapes and relative dimensions thereof may be exaggerated or omitted.

In describing embodiments in detail, redundant descriptions or descriptions of techniques that are obvious in the field are omitted. In addition, whenever any part is the to "include" other components in the following description, it is intended to include components in addition to those listed, unless the contrary is specifically indicated.

In addition, terms such as "part," "section," "module," and the like used herein mean a unit that performs at least one function or operation, which may be implemented in hardware, software, or a combination of hardware and software. Also, when one part is the to be electrically connected to another part, this includes direct connections as well as connections with other configurations in between.

Terms containing ordinal numbers, such as first, second, and the like, may be used to describe various components, but the components are not limited by such terms. These terms are used only to distinguish one component from another. For example, a second component may be named as a first component, and similarly, a first component may be named as a second component, without departing from the scope of the present disclosure.

Hereinafter, the method and apparatus for dry-cleaning an AlN heater for semiconductor fabrication equipment according to preferred embodiments of the present disclosure will be described in detail with reference to the accompanying drawings.

First, the method and apparatus for dry-cleaning an AlN heater for semiconductor fabrication equipment according to the present disclosure will be described in detail.

Figure 1:
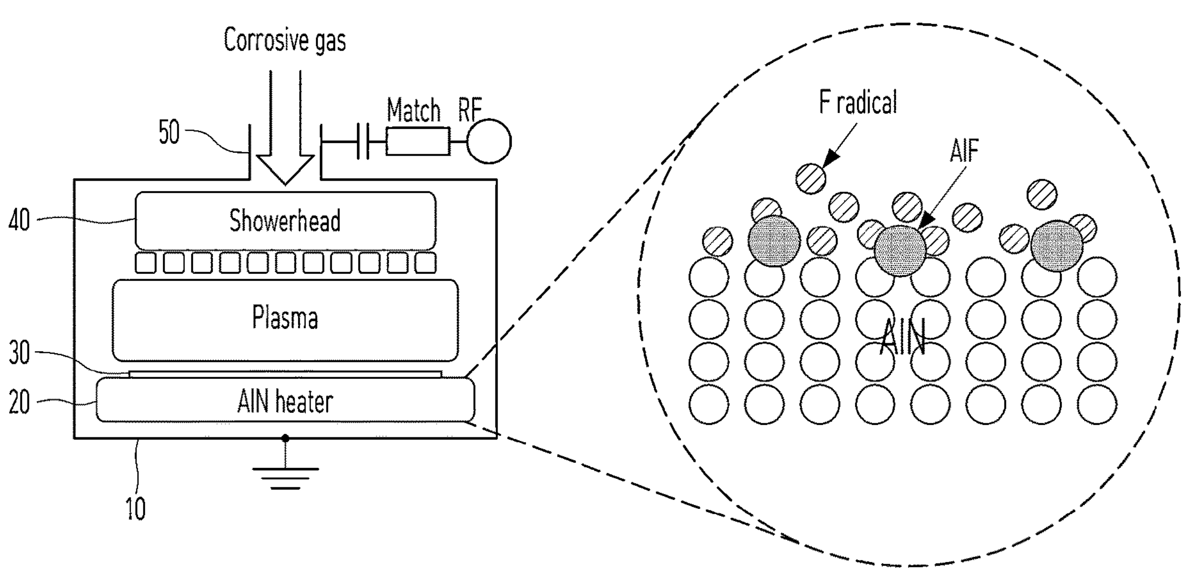
FIG. 1 is a configuration diagram including a vacuum chamber for general semiconductor fabrication equipment.
Figure 2:
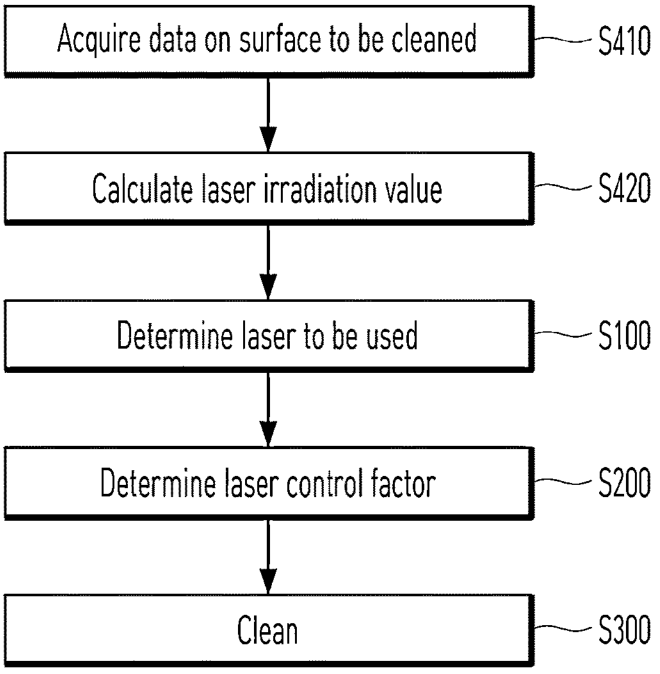
FIG. 2 is a flow chart showing a method for dry-cleaning an AlN heater for semiconductor fabrication equipment according to the present disclosure.

FIG. 2 is a flow chart showing the method for dry-cleaning an AlN heater for semiconductor fabrication equipment according to the present disclosure.

The method for dry-cleaning an AlN heater for semiconductor fabrication equipment according to the present disclosure is a method for cleaning an AlN heater included in semiconductor fabrication equipment, and as shown in FIG. 2, the method broadly includes steps of: (S100) determining a laser to be used; (S200) determining laser control factors; and (S300) cleaning.

Specifically, the method for dry-cleaning an AlN heater for semiconductor fabrication equipment according to the present disclosure is a method for cleaning an AlN heater included in semiconductor fabrication equipment, and as shown in FIG. 2, the method includes steps of: (S100) determining a laser to be used for the AlN heated to be cleaned; (S200) determining laser control factors required for cleaning with respect to the laser determined in step (S100) of determining the laser to be used; and (S300) cleaning the AlN heater using a laser based on the laser control factors determined in step (S200) of determining the laser control factors.

Step (S100) of determining the laser to be used is a process of determining the laser to be used based on the specifications of the AlN heater to be cleaned.

Specifically, in step (S100) of determining the laser to be used, an IR laser with a wavelength of 1,064 nm may be determined to be used in the present disclosure, and as confirmed through experiments described in detail below, a UV laser with a wavelength of 355 nm may also be used in the present disclosure.

Next, step (S200) of determining laser control factors is a process of determining laser control factors required for cleaning with respect to the laser to be used determined in step (S100) of determining the laser to be used.

In the present disclosure, an IR laser may be used as the laser, and a UV laser is preferably used. In step (S200) of determining laser control factors, control factors for the laser are determined.

Specifically, when the laser for which control factors are determined in step (S200) of determining laser control factors is an IR laser, it may have a frequency of 1 kHz to 1,000 kHz and a power of 50 W to 1,000 W. Here, the scan speed of the laser may be 1,000 mm/s to 50,000 mm/s.

In addition, as mentioned above, the laser that is used in the present disclosure is preferably a UV laser. Accordingly, control factors for the UV laser, determined in step (S200) of determining laser control factors, include a frequency of 1 kHz to 1,000 kHz, a power of 0.1 W (low) to 100 W (high), a focus of −1 mm to +1 mm, and a power density that satisfies the equation below. Here, the scan speed of the laser may be 1,000 mm/s to 50,000 mm/s.

Power density =

$$\frac{\text{Laser pulse energy}}{\text{spot area}} = \frac{\text{Laser power (W)} \times \text{time (s)}}{\text{spot area } (\text{cm}^2)} = \text{J/cm}^2\ (\text{kW/cm}^2)$$

wherein the spot area (cm$^2$) is the area of the beam spot, and the time is the laser irradiation time.

In this case, in step (S200) of determining the laser control factors, the power density is preferably $0.3\times10^{-3}$ to $1.2\times10^{6}$ kW/cm$^2$. In this case, the spot diameter is preferably 100 to 200 μm, and the spot area is preferably $7.85\times10^{-5}$ to $3.14\times10^{-4}$ cm$^2$.

The determination of the laser control factors can be executed through a logic program according to the values input through either an input device included in a control device of a laser generator or an input device of a control panel for controlling the laser generator.

Next, in step (S300) of cleaning, the AlN heater is cleaned using a laser based on the laser determined in step (S100) of determining the laser to be used and the control factors for the laser to be used, determined in step (S200) of determining the laser control factors.

Meanwhile, the method for dry-cleaning an AlN heater for semiconductor fabrication equipment according to the present disclosure may further include steps of: (S410) acquiring an image of the surface to be cleaned of the AlN heater to be cleaned and acquiring data on the surface to be cleaned, including the detected position coordinates of a pinhole (or lifting hole) formed in the AlN heater; and (S420) calculating a laser irradiation value determined to have the power density, which satisfies the above-described equation, based on the data on the surface to be cleaned, acquired in step (S400), wherein step (S200) of determining the laser control factors may be configured to determine a laser having the above-described power density by adjusting the working distance and/or focus distance of the laser based on the laser irradiation value calculated in step (S420) of calculating the laser irradiation value.

Step (S410) of acquiring the data on the surface to be cleaned may be performed using a known image sensor device or image data acquisition/analysis device capable of acquiring an image and processing the acquired data, thereby calculating the area and detecting and recognizing the position coordinates of the pinhole (or lifting hole).

The apparatus for dry-cleaning an AlN heater for semiconductor fabrication equipment according to the present disclosure will now be described in detail.

Figure 3:
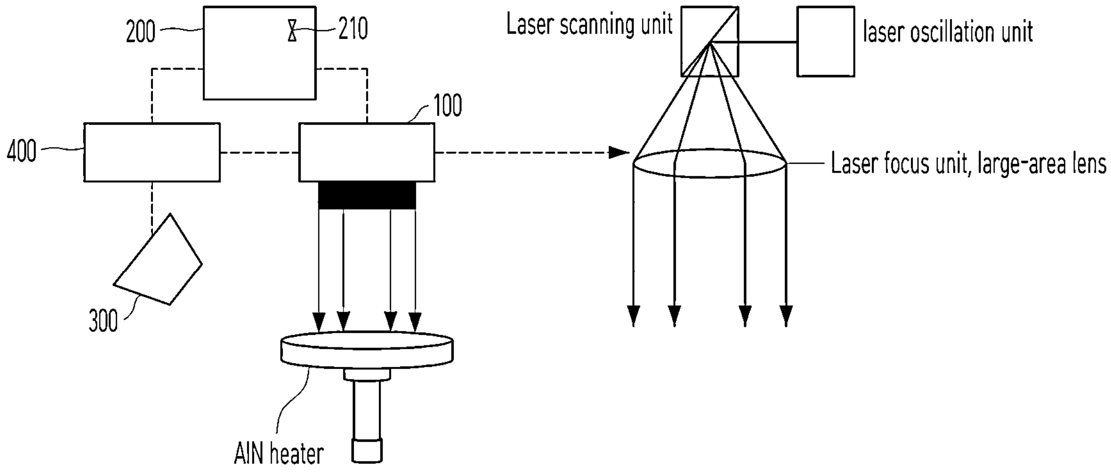
FIG. 3 schematically shows the configuration of an apparatus for dry-cleaning an AlN heater for semiconductor fabrication equipment according to the present disclosure.
Figure 4:
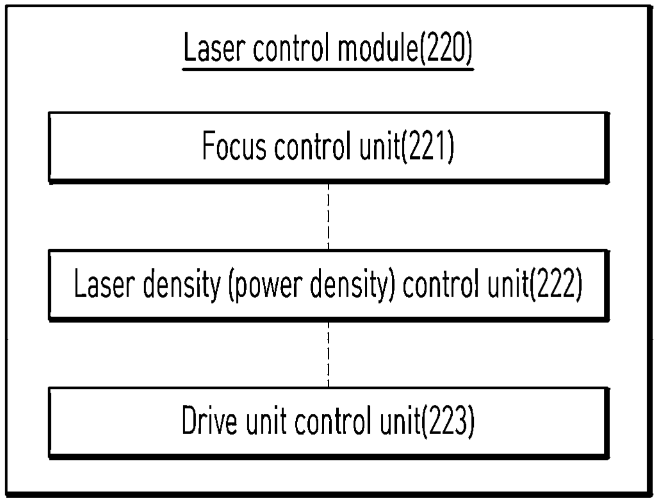
FIG. 4 is a block diagram showing the configuration of a control module of the laser control unit included in the apparatus for dry-cleaning an AlN heater for semiconductor fabrication equipment according to the present disclosure.

FIG. 3 schematically shows the configuration of the apparatus for dry-cleaning an AlN heater semiconductor fabrication equipment according to the present disclosure, and FIG. 4 is a block diagram showing the configuration of a control module of the laser control unit included in the apparatus for dry-cleaning an AlN heater for semiconductor fabrication equipment according to the present disclosure.

The apparatus for dry-cleaning an AlN heater for semiconductor fabrication equipment according to the present disclosure is an apparatus for cleaning an AlN heater included in semiconductor fabrication equipment, and as shown in FIGS. 3 and 4, the apparatus broadly includes a laser irradiation device 100 and a laser control unit 200.

Specifically, the apparatus for dry-cleaning an AlN heater for semiconductor fabrication equipment according to the present disclosure is an apparatus for cleaning an AlN heater included in semiconductor fabrication equipment, and as shown in FIGS. 3 and 4, the apparatus includes a laser irradiation device 100 configured to irradiate the AlN heater 10 to be cleaned with a laser, and a laser control unit 200 configured to control factors for the laser irradiated from the laser irradiation device 100.

In the present disclosure, the laser irradiation device 100 may be composed of a device capable of irradiating an IR laser with a wavelength of 1,064 nm or a UV laser with a wavelength of 355 nm. Preferably, it is composed of a device capable of irradiating a UV laser with a wavelength of 355 nm.

The laser control unit 200 includes a device on/off switch 210, and a laser control module 220 configured to determine control factors for the laser to be used and control a laser having the determined control factors to be irradiated.

As the laser to be used in the present disclosure, an IR laser may be used, and a scanner-type laser capable of irradiating a UV laser is preferably used. The laser control module 220 of the laser control unit 200 may determine control factors for the laser so that a laser with the determined control factors may be irradiated through the laser irradiation device 100.

In the present disclosure, the laser irradiation device 100 may be a laser irradiation device capable of irradiating an IR laser, and in this case, the frequency may be 1 kHz to 1,000 kHz and the power may be 50 W to 1000 W. Here, the laser scan speed may be 1,000 mm/s to 50,000 mm/s.

In addition, preferably, the laser irradiation device 100 that is used in the present disclosure may be a laser irradiation device capable of irradiating a UV laser, and in this case, the laser may have a frequency of 1 kHz to 1,000 kHz and a power of 1,000 kHz. Here, the laser scan speed may be 1,000 mm/s to 50,000 mm/s.

In addition, the laser control module 220 of the laser control module 220 includes a focus control unit 221, and a laser power density calculation unit 222 configured to control the laser having a specific laser power density to be irradiated.

The focus control unit 221 controls the laser focus to be between −1 mm and +1 mm, and the laser power density calculation unit 222 determines a power density satisfying the equation below.

$$\text{Power density} = \frac{\text{Laser pulse energy}}{\text{spot area}} = \frac{\text{Laser power (W)} \times \text{time (s)}}{\text{spot area } (\text{cm}^2)} = \text{J/cm}^2\ (\text{kW/cm}^2)$$

wherein the spot area ($cm^2$) is the area of the beam spot, and the time is the laser irradiation time.

In the present disclosure, the laser to be used is preferably a UV laser, and the power density determined in the laser power density calculation unit 222 is preferably $0.3\times10^{-3}$ to $1.2\times10^{6}$ $kW/cm^2$. In this case, the spot diameter is preferably 100 to 200 μm, and the spot area is preferably $7.85\times10^{-5}$ to $3.14\times10^{-4}$ $cm^2$.

Meanwhile, the apparatus for dry-cleaning an AlN heater for semiconductor fabrication equipment according to the present disclosure may further include: a surface data acquisition device 300 that acquires an image of the surface to be cleaned of the AlN heater 10 to be cleaned, calculates a cleaning control value for the surface to be cleaned based on the acquired image, and transmits the calculated cleaning control value to the laser control module 220; and a laser irradiation device driving unit 400 configured to adjust the working distance of the laser irradiation device 100, wherein the laser output density calculation unit 222 of the laser control module 220 determines a laser irradiation value determined to have a power density, which satisfies the above-described equation, based on the cleaning control value transmitted from the surface data acquisition device 300, and the laser control module 220 may further include a driving unit control unit 223 that controls the laser irradiation device driving unit 400 to adjust the working distance of the laser irradiation device driving unit 400 based on the laser irradiation value calculated by the laser power density calculation unit 222.

The surface data acquisition device 300 may be composed of a known image sensor device or image data acquisition/analysis device capable of processing image data, thereby calculating the area and detecting and recognizing the position coordinates of the pinhole (or lifting hole).

Meanwhile, the inventor of the present disclosure conducted experiments to evaluate the effect of the method for dry-cleaning an AlN heater for semiconductor fabrication equipment according to the present disclosure, as described below.

Figure 5:
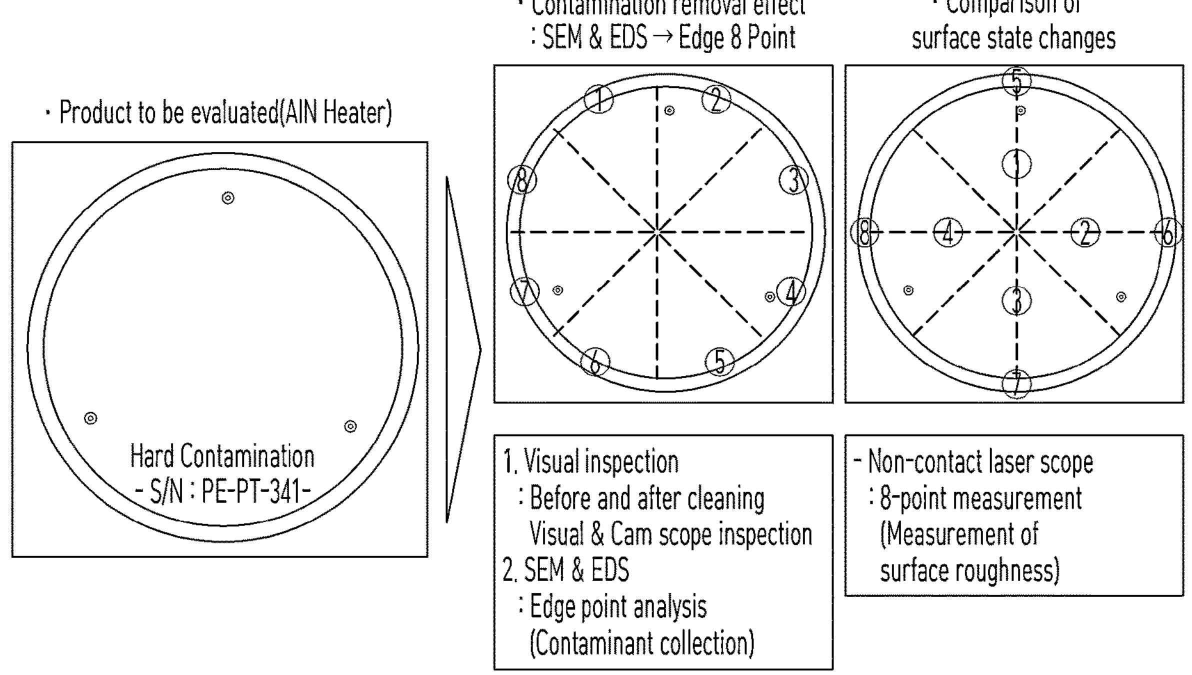
FIG. 5 shows test verification items in an experiment on the method for dry-cleaning an AlN heater for semiconductor fabrication equipment according to the present disclosure.
Figure 6:
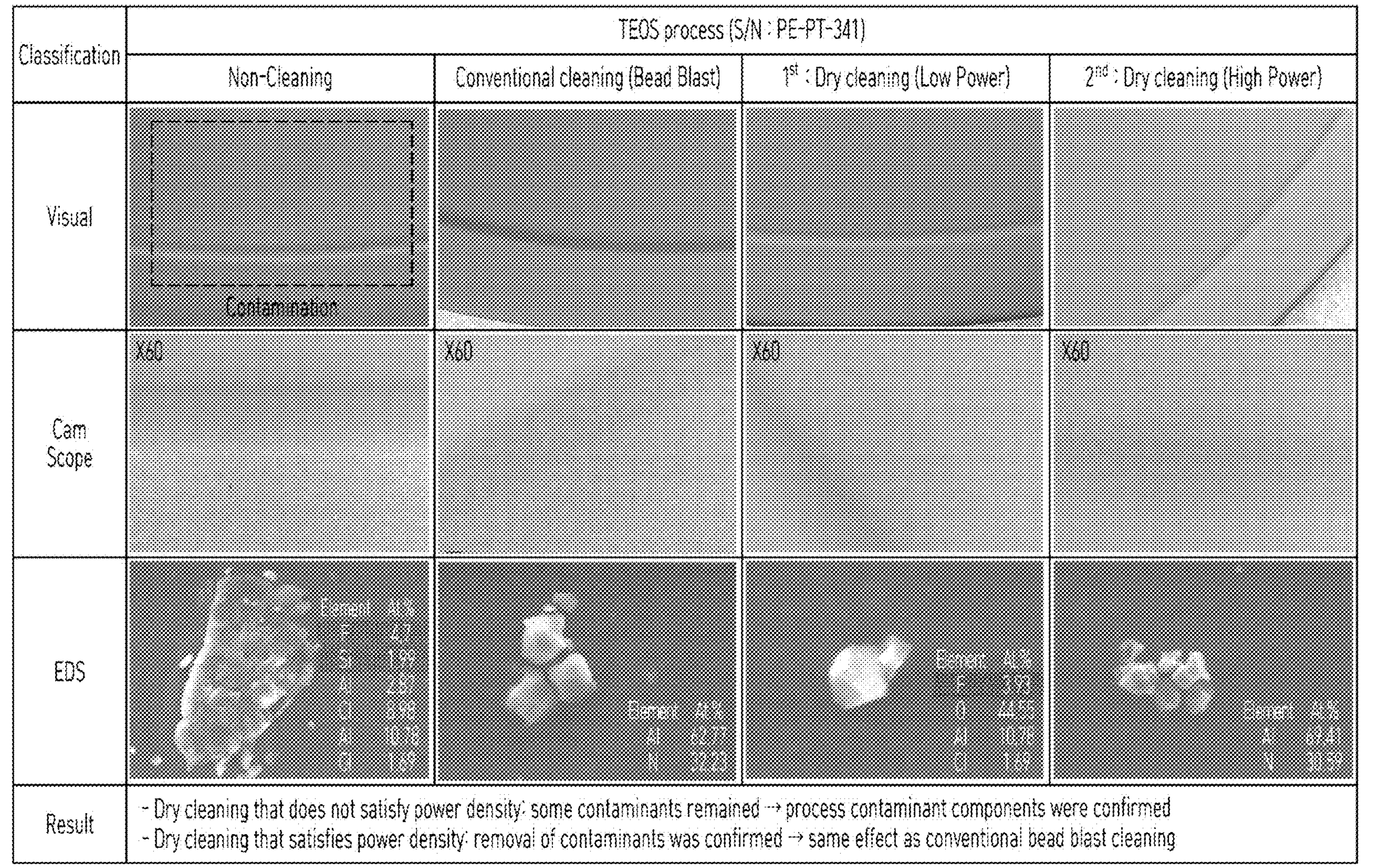
FIGS. 6 and 7 show the cleaning effect of the present disclosure in an experiment on the method for dry-cleaning an AlN heater for semiconductor fabrication equipment according to the present disclosure.
Figure 7:
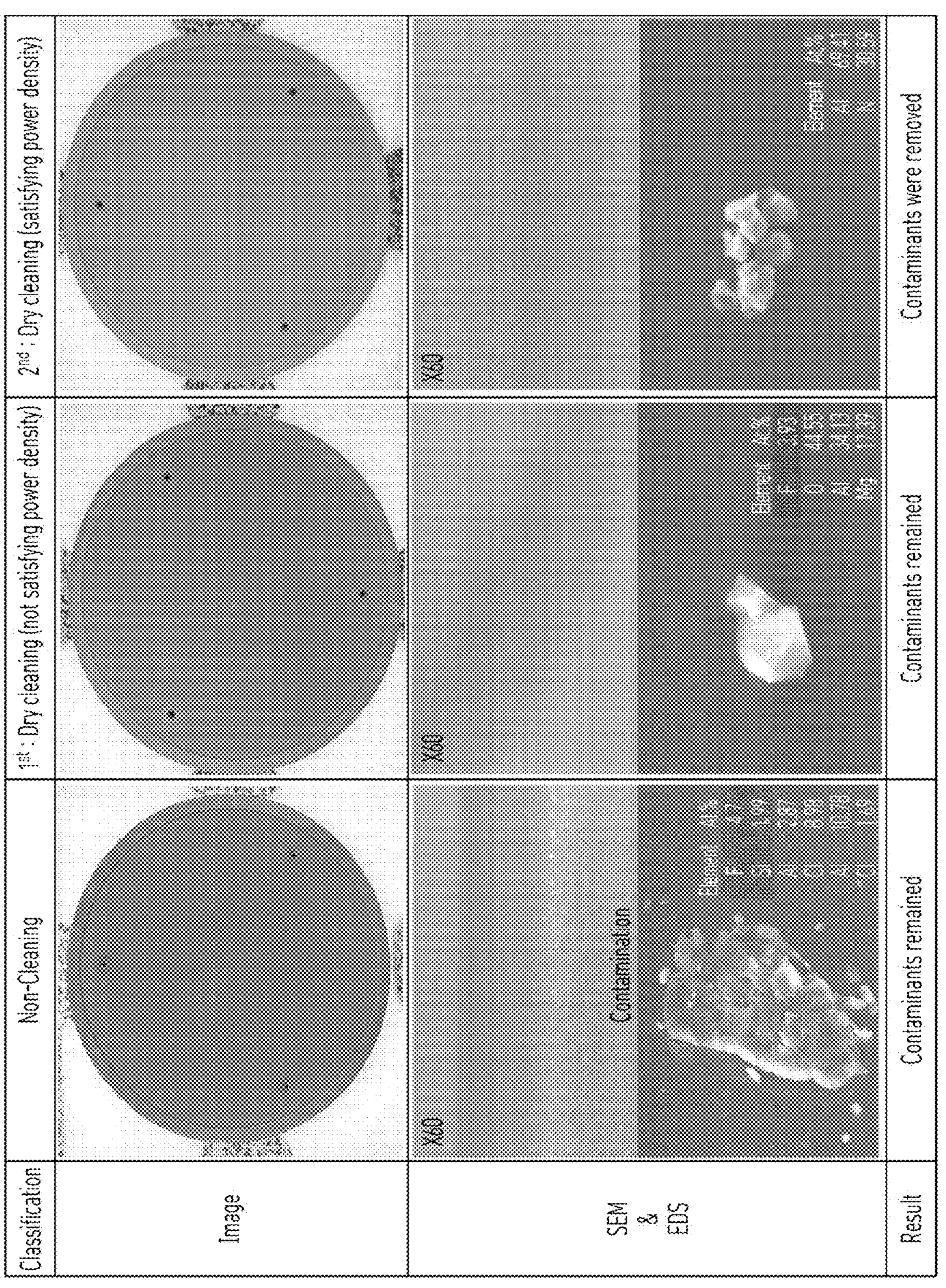
Figure 8:
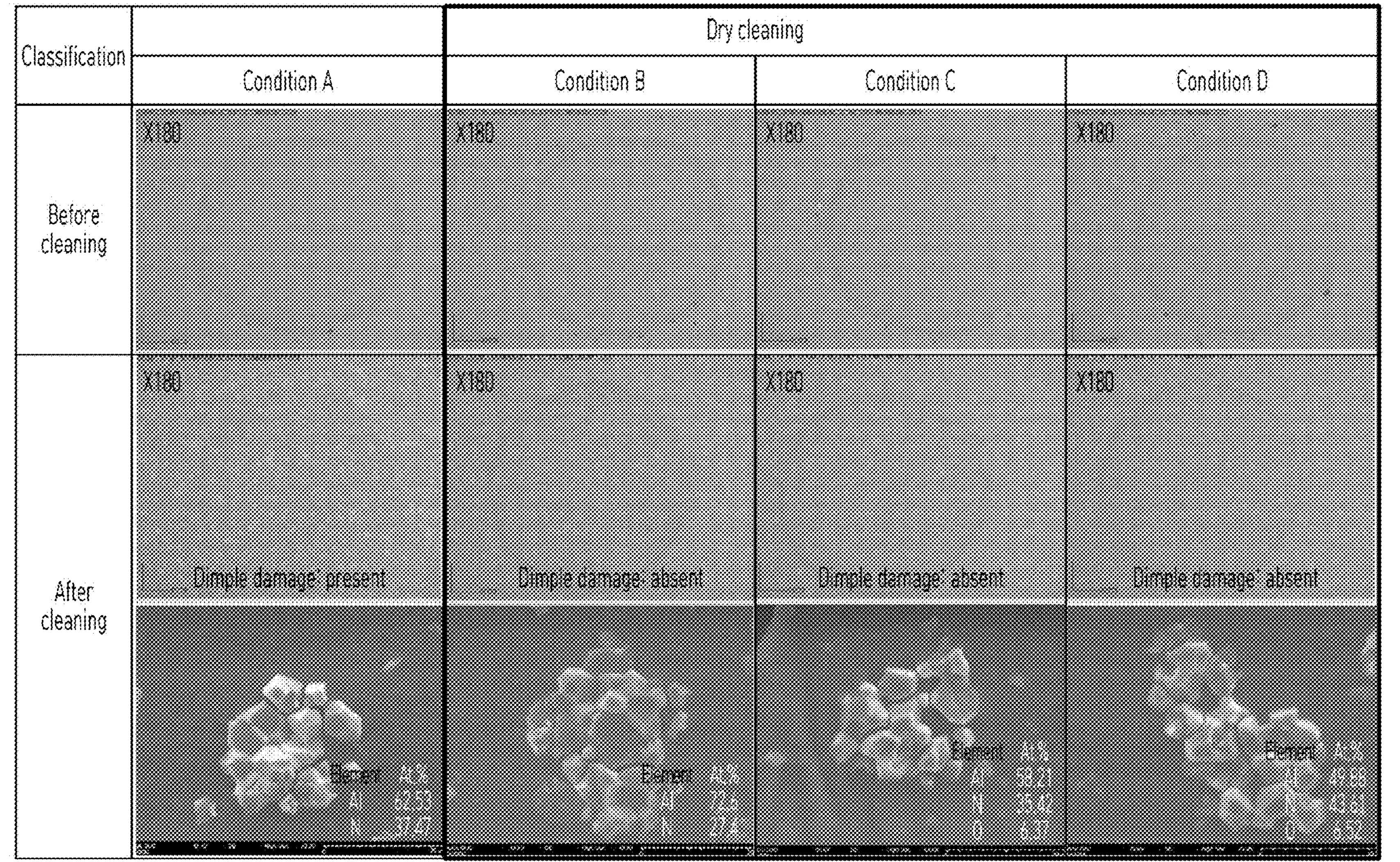
FIG. 8 shows whether damage is present in the dimple portion (pinhole or lifting hole) of an AlN heater in an experiment on the method for dry-cleaning an AlN heater for semiconductor fabrication equipment according to the present disclosure.
Figure 9:
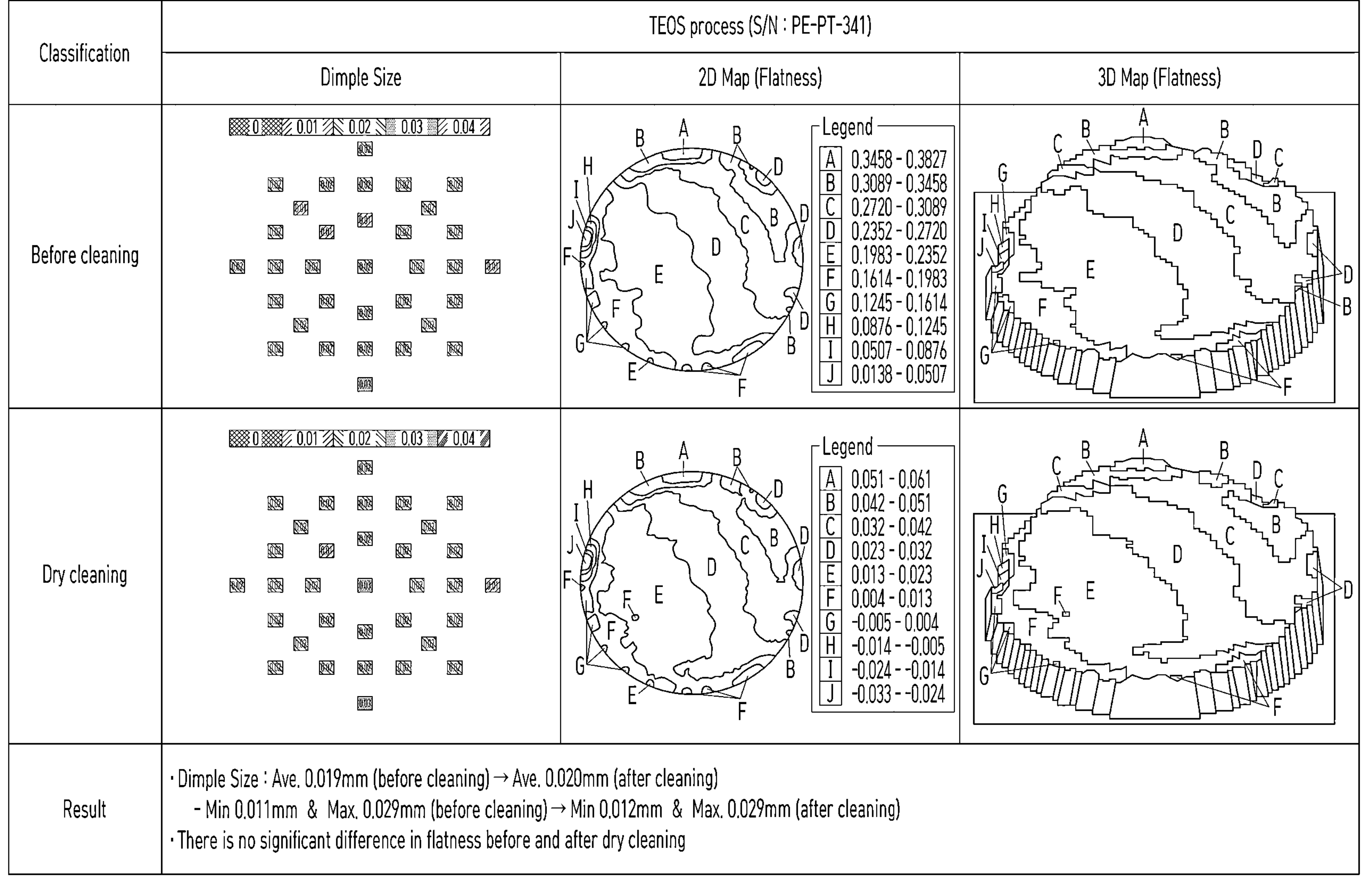
FIG. 9 shows the size (height) and flatness of the dimple portion (pinhole or lifting hole) of an AlN heater in an experiment on the method for dry-cleaning an AlN heater for semiconductor fabrication equipment according to the present disclosure.
Figure 11:
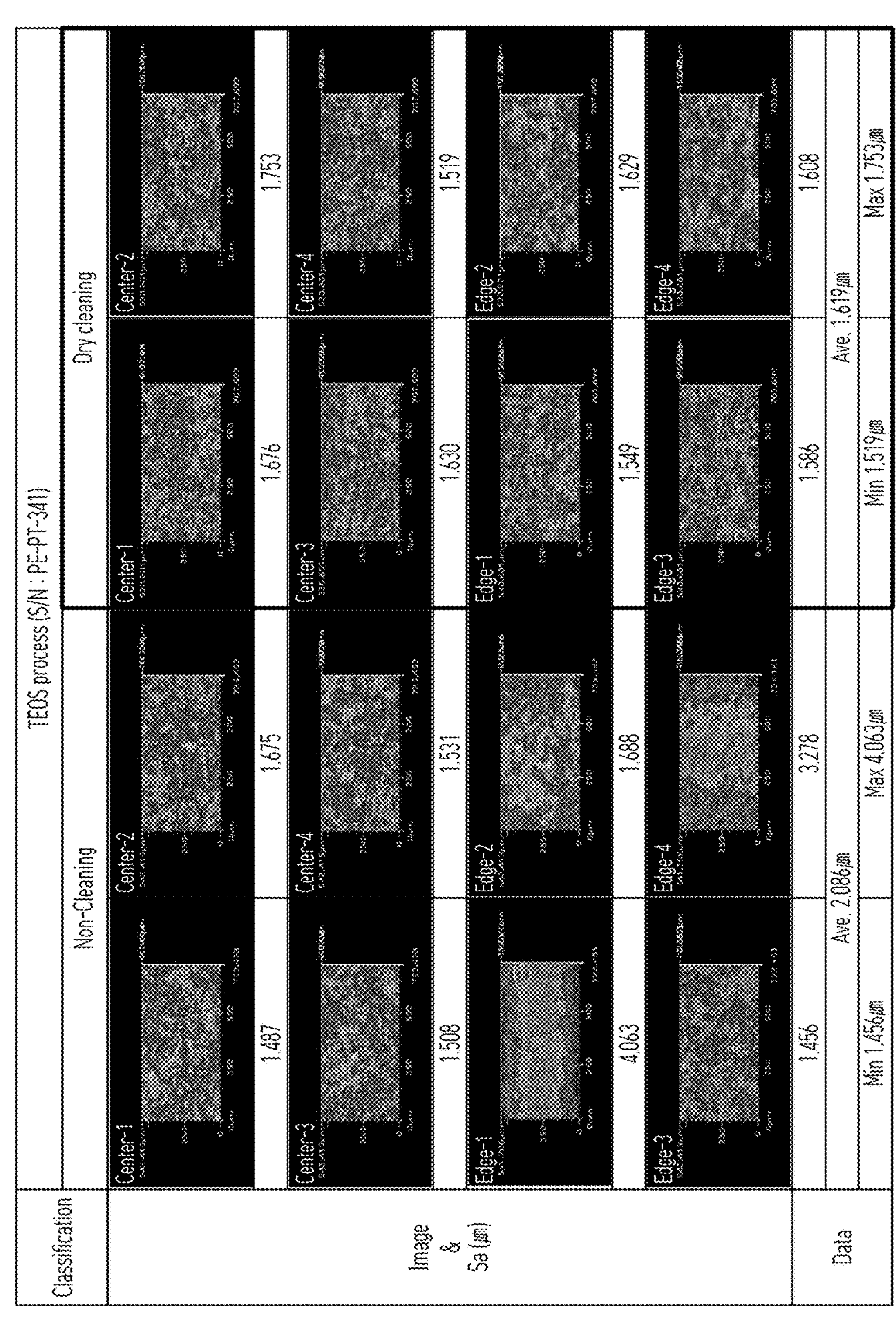
FIG. 11 shows the results of measuring surface roughness (Sa) in an experiment on the method for dry-cleaning an AlN heater for semiconductor fabrication equipment according to the present disclosure.

FIG. 5 shows test verification items in an experiment on the method for dry-cleaning an AlN heater for semiconductor fabrication equipment according to the present disclosure, FIGS. 6 and 7 show the cleaning effect of the present disclosure in an experiment on the method for dry-cleaning an AlN heater for semiconductor fabrication equipment according to the present disclosure, and FIG. 8 shows whether damage is present in the dimple portion (pinhole or lifting hole) of an AlN heater in an experiment on the method for dry-cleaning an AlN heater for semiconductor fabrication equipment according to the present disclosure. FIG. 9 shows the size (height) and flatness of the dimple portion (pinhole or lifting hole) of an AlN heater in an experiment on the method for dry-cleaning an AlN heater for semiconductor fabrication equipment according to the present disclosure, FIG. 10 shows the results of comparing the height of the dimple portion (pinhole or lifting hole) of an AlN heater in an experiment on the method for dry-cleaning an AlN heater for semiconductor fabrication equipment according to the present disclosure, and FIG. 11 shows the results of measuring surface roughness (Sa) in an experiment on the method for dry-cleaning an AlN heater for semiconductor fabrication equipment according to the present disclosure.

As shown in FIGS. 5 to 11, as a result of evaluating the effect E the method for dry-cleaning an AlN heater for semiconductor fabrication equipment according to the present disclosure, it was confirmed that the method of the present disclosure could remove effectively and simultaneously remove contaminants, that is, organic, metallic, and inorganic contaminants, from the AlN heater.

In particular, as shown in FIG. 6, it was confirmed that the method of the present disclosure could exhibit the same effect as conventional bead blast cleaning by cleaning the AlN heater with a laser having a power density in a specific range. Also, as shown in FIGS. 8 to 11, it was confirmed that the method of the present disclosure could effectively clean the dimple portion of the AlN heater without affecting the size or flatness of the AlN heater.

Figure 12:
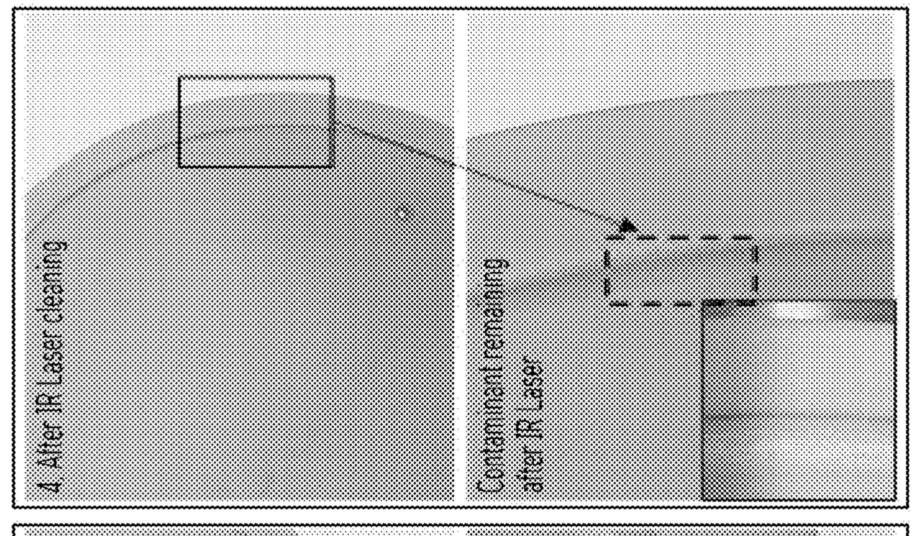
FIGS. 12 and 13 show an AlN heater before and after cleaning the AlN heater using an IR laser in an experiment on the method for dry-cleaning an AlN heater for semiconductor fabrication equipment according to the present disclosure.
Figure 12:
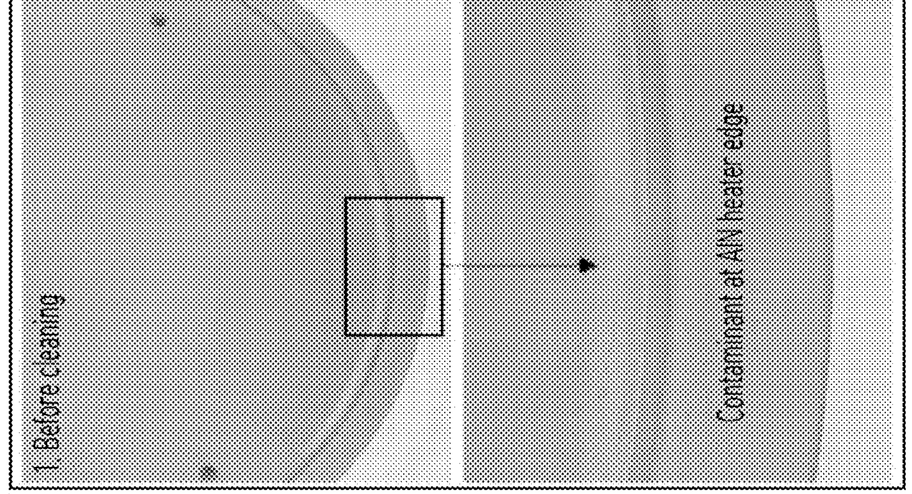
Figure 12:
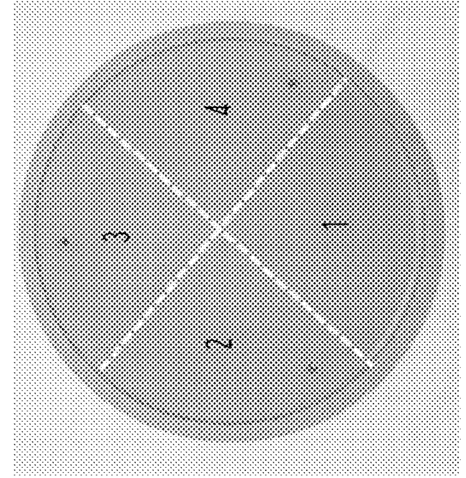
Figure 13:
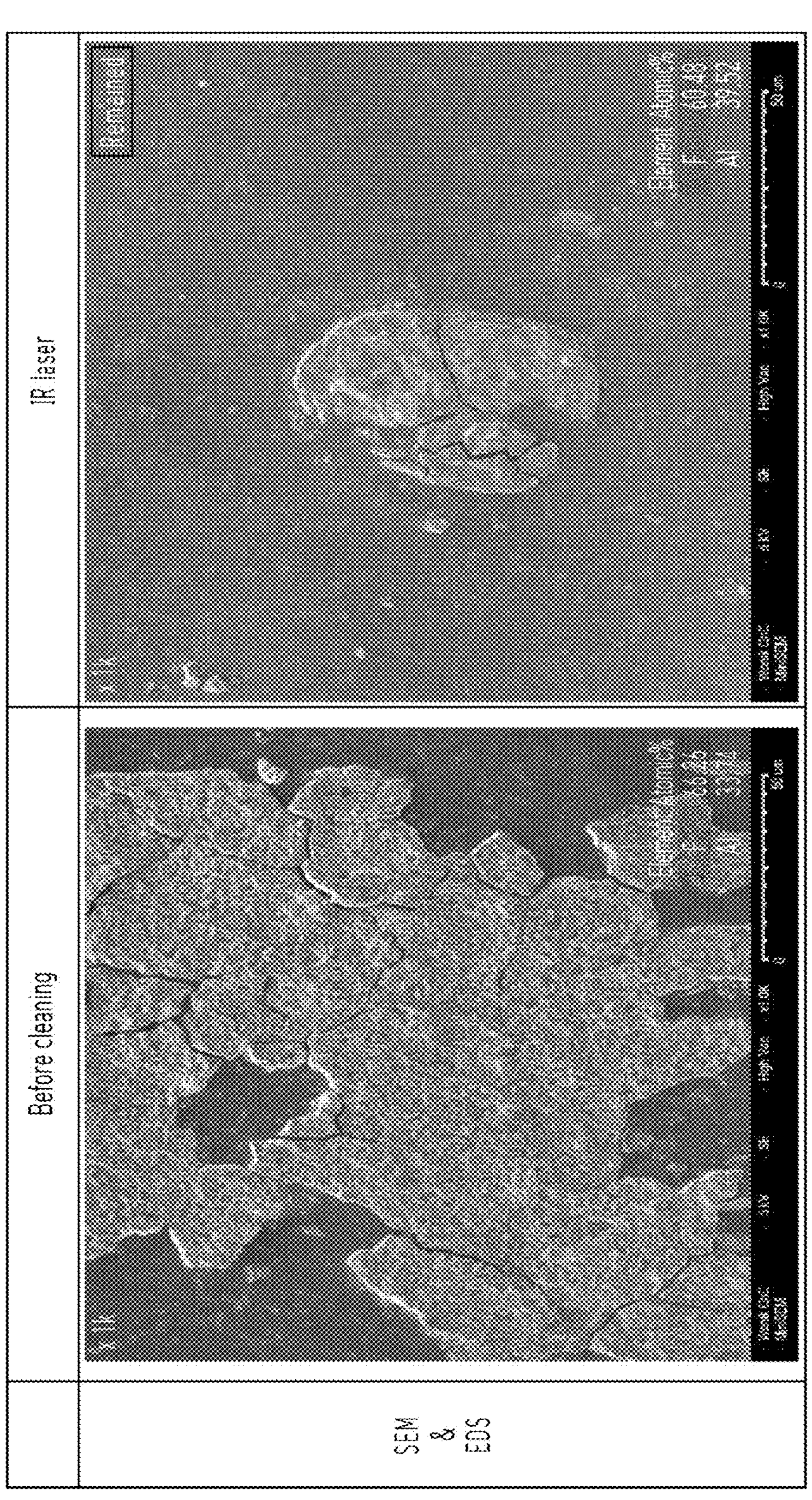

Meanwhile, FIGS. 12 and 13 show an AlN heater before and after cleaning the AlN heater using an IR laser in an experiment on the method for dry-cleaning an AlN heater for semiconductor fabrication equipment according to the present disclosure. Control factors for the IR laser in FIGS. 12 and 13 are as follows.

Wavelength: 1,064 nm

Frequency: 100 kHz to 200 kHz

Power: 100 W (max. power)

Scan speed: 3,000 mm/s, 5,000 mm/s, or 10,000 mm/s

As a result of the experiment, as shown in FIGS. 12 and 13, it was confirmed that, when an IR laser was used, it removed aluminum fluoride contaminants by raising the temperature of the contaminates and sublimating the same, but the effect of raising the temperature with the laser was limited to a local region, and thus when the temperature decreased to 450° C. or below as the laser left the region, aluminum fluoride contaminants were immediately deposited again and remained on the AlN heater. Also, it was confirmed that, when an air suction device was used together with the IR laser for this reason, it could partially remove aluminum fluoride contaminants by sucking them in before deposition of the contaminants, but there was a possibility that the contaminants might remain.

In contrast, it was confirmed that the UV laser removed the aluminum fluoride contaminants by breaking the bonds of the contaminants, and thus the aluminum fluoride contaminants were not deposited again even when the laser left the region, suggesting that the use of the UV laser exhibited the most efficient and effective cleaning properties.

According to the method and apparatus for dry-cleaning an AlN heater for semiconductor fabrication equipment according to the present disclosure as described above, it is possible to efficiently and effectively remove fluorine-containing contaminants, especially organic, metallic, and inorganic contaminants at the same time, generated on the AlN heater.

In addition, according to the present disclosure, it is possible to remove submicron-sized contaminants, thereby minimizing changes in roughness, thus making it possible to omit a polishing process, and it is possible to replace mass-production cleaning that is based on chemical treatment or bead blasting.

While various embodiments have been described above, it will be understood to those skilled in the art that the embodiments described are by way of example only. Accordingly, the disclosure described herein should not be limited based on the described embodiments.

What is claimed is:

1. A method for dry-cleaning an aluminum nitride (AlN) heater for semiconductor fabrication equipment, the method comprising steps of:

acquiring surface data of a surface of an AlN heater to be cleaned;

determining, based on the surface data, a type of laser to be used for cleaning the AlN heater;

determining, based on the surface data and the type of laser, laser control factors of a laser required for cleaning the AlN heater; and irradiating the laser to the surface of the AlN heater to clean the AlN heater based on the laser control factors determined in the step of determining the laser control factors, wherein the laser is configured to blast beads remaining on the surface of the AlN heater.

2. The method according to claim 1, wherein the acquiring surface data is performed using a image sensor device or image data acquisition/analysis device configured to acquire an image and process the acquired surface data.

3. The method according to claim 2, wherein the acquiring surface data includes calculating a spot area and detecting and recognizing position coordinates of pinholes.

4. The method according to claim 1, wherein the type of laser includes an IR laser and a UV laser.

5. The method according to claim 4, wherein the laser control factors for the IR laser include a frequency of 1 kHz to 1,000 kHz, a power of 50 W to 1,000 W, a scan speed of 1,000 mm/s to 50,000 mm/s, and an output density satisfying the following equation:

$$\text{Power density} = \frac{\text{Laser pulse energy}}{\text{spot area}} = \frac{\text{Laser power (w)} \times \text{time (s)}}{\text{spot area (cm}^2\text{)}} = \text{J/cm}^2\ (\text{kW/cm}^2),$$

wherein the spot area ($cm^2$) is an area of a beam spot, and the time is a laser irradiation time.

6. The method according to claim 5, wherein the output density determined in the step of determining the laser control factors is $0.3\times10^{-3}$ to $1.2\times10^{6}$ kW/$cm^2$.

7. The method according to claim 4, wherein the laser control factors for the UV laser include a frequency of 1 kHz to 1,000 kHz, a power of 0.1 W to 100 W, a scan speed of 1,000 mm/s to 50,000 mm/s, and an output density satisfying the following equation:

$$\text{Power density} = \frac{\text{Laser pulse energy}}{\text{spot area}} = \frac{\text{Laser power (w)} \times \text{time (s)}}{\text{spot area (cm}^2\text{)}} = \text{J/cm}^2\ (\text{kW/cm}^2),$$

wherein the spot area ($cm^2$) is an area of a beam spot, and the time is a laser irradiation time.

8. The method according to claim 7, wherein the output density determined in the step of determining the laser control factors is $0.3\times10^{-3}$ to $1.2\times10^{6}$ kW/$cm^2$.

* * * * *